Jan. 13, 1959    J. G. SPERLING    2,869,002

TRANSISTOR FREQUENCY DIVIDERS

Filed May 25, 1955

J. G. SPERLING
INVENTOR.

BY Darby & Darby
ATT'YS 2,869,002

TRANSISTOR FREQUENCY DIVIDERS

Jacob George Sperling, Great Neck, New York, assignor to Emerson Radio & Phonograph Corporation, Jersey City, N. J., a corporation of New York Application May 25, 1955, Serial No. 511,072

6 Claims. (Cl. 307—88.5)

The present invention is directed to transistor circuits and is more particularly concerned with transistor circuits for pulse frequency division. Pulse frequency divider circuits are known using vacuum tubes. The manifest advantages of transistors has directed attention to their use in generally all types of circuits, including pulse frequency divider circuits. However, in the use of transistors in such circuits it has been discovered that the unavoidable variations in transistor characteristics, particularly those of the point contact type, has heretofore prevented design of a pulse frequency divider circuit which is consistently usable with stable characteristics over a wide range of temperature variation and whose performance can be maintained stable despite substitution of transistors.

It is an important object of the present invention to provide pulse frequency divider circuits using a single transistor with a minimum number of components adapted to operate stably to produce a desired division ratio for a maximum number of available transistors of the same type without requiring any circuit readjustment.

It is another object to provide such circuits for use with either point contact or junction type transistors.

It is a further object of the present invention to provide transistor divider circuits which are stable as to output amplitude and frequency despite wide changes in operating temperature.

Other objects and advantages of the present invention will become more fully apparent from consideration of the following description of preferred embodiments of the invention taken in conljunction with the appended drawings, in which.

Figure 1:
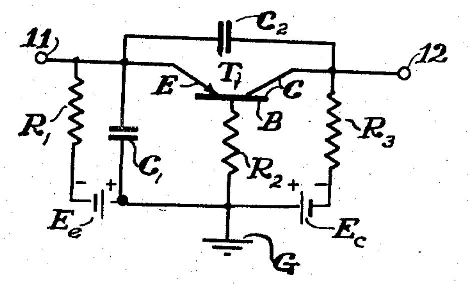
Figure 1 shows a schematic circuit diagram of a pulse frequency divider circuit utilizing a single point contact resistor in accordance with the present invention.

In the circuit of Figure 1 the input terminal 11 is connected conductively to the emitter E of the transistor T which is of the point contact type. The base B of the transistor T is connected to ground G through resistor R2, which has a medium resistance value of the order of 10 kilohms. The emitter E is also connected to a source of biasing potential $E_e$ through an input resistor R1, the biasing potential being indicated as negative in polarity relative to ground G and having a representative value of 45 volts. The collector C of the transistor T is connected directly to the output terminal 12 and also through an output or load resistor R3 to a source $E_c$ of negative collector voltage representatively of 45 volts relative to ground. The input resistor R1 is preferably of a high resistance value of the order of 680,000 ohms while the output resistor R3 is of moderate value such as 5,600 ohms. A condenser C1 connects emitter E to ground G. A further condenser C2 connects the emitter E to the collector C, and its function is described more in detail below.

Figure 2:
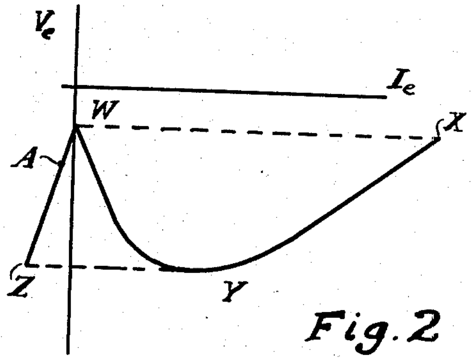
Figure 2 is a graph showing the emitter voltage versus emitter current characteristics for a transistor in the circuit of Figure 1, which graph is useful in explaining the operating characteristics of the circuit of Figure 1.

The circuit just described is essentially a monostable relaxation oscillator or multi-vibrator. The condenser C1 may be termed a timing capacitor as can best be understood by referring to Figure 2, which shows the so-called "N" diagram portraying the emitter operation during the dynamic operating cycle. The normal or quiescent operating point of the transistor T is indicated at A in Figure 2 and shows the relative emitter current and voltage in the absence of input applied to 11. The application of a positive polarity input pulse of a suitable amplitude to the input terminal 11 makes the bias or potential of the emitter E more positive, which shifts the operating point of the transistor T from point A to point W. This substantially instantaneously charges the capacitor C1 and initiates the dynamic cycle. Capacitor C1 presents essentially a short circuit for current changes in the emitter circuit and permits a rapid increase in emitter current without appreciable change in emitter potential. As a result, the operating point of the transistor jumps from point W to turning point X, showing a marked increase in emitter current without substantial change in emitter potential. As a consequence, the collector current and hence the voltage drop across the load resistor R3 will increase sharply, producing the leading or rising edge of the output pulse appearing at the output terminal 12. After the input pulse has terminated, the timing capacitor C1 will start to discharge through resistor R1, since the transistor T is essentially saturated. The emitter and collector currents will at first change very little, so that during this time the flat top of the output pulse is generated. As discharge of C1 continues, the operating point of the transistor T moves from X to Y. Upon reaching point Y, which is the "valley" point of the "N" curve, the operating point jumps to point Z. During this interval the collector current falls sharply, producing a similar change in the collector voltage and forming the trailing edge of the output pulse appearing at the output terminal 12. At this time the collector voltage falls to the value $E_c$. The operating point of the transistor then moves slowly up to the initial operating point A to await another trigger pulse and the recommencement of another cycle.

When the time constant of the emitter circuit as determined by the capacitor C1 and the emitter-to-base resistance of the transistor plus resistance R2 is much longer than the period of the incoming trigger pulse, this circuit will act as a frequency divider, since after the operating cycle is initiated by one pulse the circuit is essentially independent of input pulses until the operating point returns substantially to point A. For varying the ratio of frequency division thus effected, the value of the capacitor C may be suitably adjusted, or the emitter circuit time constant may be otherwise varied.

It has been found that variations in the parameters of the transistor, such as the current amplification factor $\alpha$ the quiescent-stable collector current, and the resistances in the emitter and collector circuit, namely R1 and R3 respectively, considerably influence the nature of the operation, and the variation in transistor characteristics encountered in normal run-of-the-mill production of such transistors makes it almost impossible to obtain the same performance from a circuit of this type when one transistor is substituted for another unless the circuit component values are readjusted for optimal and stable performance. However, according to the present invention, it has been found that, by the addition of the capacitor C2 in proper relationship to capacitor C1, the circuit was stabilized to such an extent as to render it substantially independent of the normal variations in the transistor being used. This capacitor C2 provides a positive feedback loop from collector to emitter augmenting the emitter input voltage. It was discovered that, for maximum sensitivity (that is, for minimum trigger voltage necessary to actuate a cycle of operation), the difference between the bias voltage applied to the emitter E and the volt-drop across the output resistor R3 when the emitter circuit is open-circuited (which is the product of the value of resistance R3 by the collector current when the emitter circuit is open) should be as small as possible. The use of the capacitor C2 by its positive feedback effectively decreases this difference and hence increases the sensitivity of the circuit. In addition, the capacitor C2 forms a second timing path and in conjunction with the timing capacitor C1 stabilizes the division ratio of the divider by making it substantially independent of the amplitude of the input trigger pulse so long as the total combined voltage applied to the emitter is sufficient to fully turn the transistor on; an excessive input trigger voltage impressed on the emitter serves merely to saturate the transistor and hence has no harmful effect.

With the two timing capacitors C1 and C2 in use, the operation during the dynamic cycle discussed above is modified slightly. The input trigger pulse turns the transistor on and charges both capacitors C1 and C2, shifting the operating point from W to X during which period the leading edge of the output pulse is generated. At the turning point X the two capacitors C1 and C2 start to discharge. Capacitor C2 will start to discharge first and essentially determines the pulse width. If the emitter resistor R1 were made considerably smaller, such as of the order of 20,000 ohms, full saturation would occur providing a definite narrow flat top. However, for high values of this resistor and using the high negative bias for the emitter as is desirable for monostable operation, the emitter is not in a saturated state for any appreciable length of time, and provides only a sloping top for the output pulse. The relatively narrow width of the flat top portion is caused by the relatively small time constant of the circuit of capacitor C2 as compared with that of C1, and occurs when the operating point traverses from X to Y. The balance of operation of the dynamic cycle is the same as before. As indicated, the value of capacitor C1 is chosen to be greater than that of C2. These values for any specified transistor type may be optimized for maximum transistor interchangeability, and thereafter provide the desired independence from transistor variations.

Figure 3:
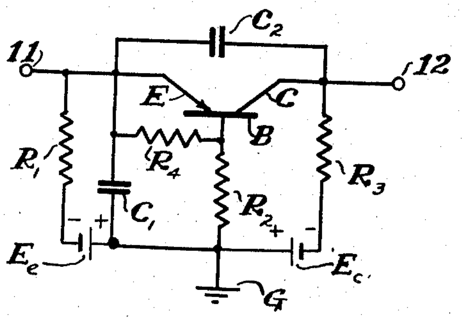
Figure 3 shows a circuit similar to that of Figure 1 but additionally incorporating a further stabilizing circuit.

The circuit of Figure 3 is similar to that of Figure 1 with the addition of the resistor R4 which further increases the stability of the transistor circuit. The resistor R4 holds the voltage across the capacitor C1 to a value substantially that of the volt-drop across the base resistor R2, which is equal to the product of the resistance of R2 times the open-emitter-circuit collector current. As indicated above, it is this volt-drop which in conjunction with the emitter bias determines the required trigger pulse amplitude, and thereby determines the sensitivity of the circuit and also the operating point A.

By the circuit of Figure 3, when using a frequency division ratio of 2 to 1, it was found that a hundred percent interchangeability of a group of transistors was obtainable without change in stability or operating characteristics, as compared to but 30 percent interchangeability for the circuit of Figure 1 omitting the capacitor C2. Also, greatly improved stability over a wide range of temperatures was obtained.

It will be understood that where higher division ratios are desired, several circuits of the present type may be cascaded. A circuit of the type of Figure 3 will operate satisfactorily to provide division ratios of 2, 3 or 4 to 1 and over a temperature range having an upper limit of substantially 60° C., with uniform operating characteristics despite interchanging of transistors.

While the foregoing description has been directed to point contact resistors, similar circuits may be used with junction transistors, either of the PNP or NPN types, providing equally advantageous results. However, it will be understood that the mode of operation is somewhat different due to the fact that, while a point contact transistor has a current gain of greater than unity, the current gain of junction transistors is less than unity.

Figure 4:
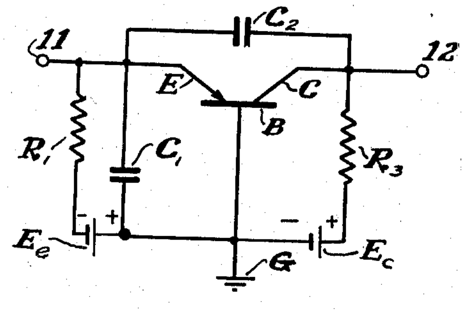
Figure 4 is a schematic circuit diagram of another form of the invention using a junction transistor.

Figure 4 illustrates a circuit of a junction transistor of the NPN type incorporating the present invention. As before, the input terminal 11 is connected directly to the emitter E which is biased from a source $E_e$ through the input resistor R1; in this case 22,000 ohms is a representative value for input resistor R1. The base B of the transistor T is connected directly to ground G and the timing capacitor C1 is connected between the emitter E and the grounded base B. The output resistor R3 which may have a value of the order of 10,000 ohms is connected between the collector C and the collector potential source $E_c$, the collector C being directly connected to the output terminal 12. As before, a feedback or second timing capacitor C2 is connected between the emitter E and collector C.

As indicated, because of the less-than-unity current gain of the junction transistor, no oscillations would be obtained in the absence of the capacitor C2. However, the capacitor C2 if sufficiently large feeds back sufficient current to the emitter circuit to overcome the losses in the loop and to sustain oscillations. The transistor T is biased to a low conduction state by the negative bias $E_e$, representatively of —22 volts. A negative input pulse P applied to the emitter E brings the transistor T to a much higher conducting state and appears as an amplified pulse across the collector output resistor R3. At the same time a portion of the output signal appearing across output resistor R3 is fed back to the emitter or input circuit, the value of the fed back signal being determined by the voltage divider formed by C2 and C1, the larger C2 is, the more feedback 13 provided. Under static conditions, in the absence of input pulses, capacitor C2 has its respective terminals at the potential existing at the emitter and collector and hence the voltage across it is the difference between $E_e$ and $E_c$; since these potentials are of opposite polarity, being respectively —22 volts and +22 volts in the example given, the voltage across condenser C2 will be 44 volts. The first input or trigger pulse causes the collector circuit to conduct and thereby sharply discharges the condenser C2 which thereafter exponentially recharges to its quiescent value. The discharge time for C2 is much shorter than its charge time, since it discharges through the collector-to-base resistance which is relatively low the recharging occurs through R1 and R3. The transistor causes conduction when C2 is discharged. The following trigger pulses occurring before condenser C2 is recharged to its quiescent value are not sufficient in amplitude to overcome the effect of the charging current through condenser C2; hence they cannot throw the transistor into conduction. Therefore, frequency division occurs, the division ratio being dependent upon the time constants involved and upon the time interval before conduction can start again, during which time a number of trigger pulses are suppressed.

The input capacitor C1 serves as part of the feedback path voltage divider circuit but has very little to do with the formation of the output pulse since, after termination of the input trigger pulse, C1 discharges almost immediately into the high conduction circuit between emitter and base. The value of C1 is not critical but must not be so large as to bypass the input pulse signal to ground. On the other hand, it must be large enough to permit capacitor C2 to charge to a sufficient voltage for permitting frequency division. Capacitor C1 should be a few times as large as C2, a preferred figure being two to three times as large.

For PNP transistors, the bias and input polarities are reversed, providing thereby the same type of operation and results.

Figure 5:
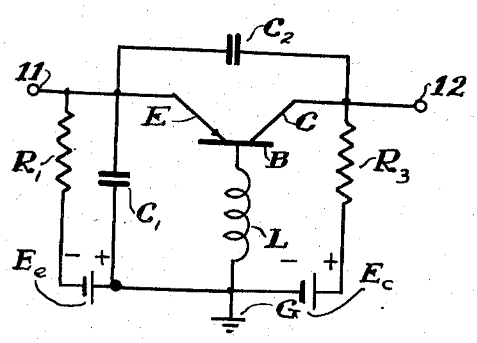
Figure 5 is a schematic circuit diagram of a modification of Figure 4.

For frequency division ratios of 3 or 4, it is desirable to insert a small inductor L in the circuit between base and ground so as to increase the amount of positive feedback. This is shown in Figure 5. However, this base inductor L must not be so large in value as to cause severe oscillations. The varying base current flowing through the inductor L develops a large base voltage proportional to the inductance times the rate of change of current. This large change of base voltage causes a correspondingly large change in collector current and thereby improves operation.

It will be understood that divider circuits of the present type may be cascaded where large division ratios are desired. For example, a first stage may divide down by 2:1, and a second stage by 4:1 to yield 8:1 division. Preferably, grounded collector isolating stages similar to cathode follower stages, are interposed between the divider stages to prevent loading on the preceding divider stage.

It is believed that the successful stable operation of these divider circuits over wide temperature variation is due primarily to the increased regeneration occurring at higher temperatures, counteracting a concomitant reduction in collector resistance. For the grounded base circuit used here, collector resistance decreases with increasing temperature, while the current gain $\alpha$ remains relatively constant and the quiescent collector current and the emitter resistance increase. The increase in emitter resistance and decrease in collector resistance would normally mean that the output and division ratio would decrease. However, the feedback capacitor C2 serves as a temperature compensating element, since its fixed capacitance in shunt with the increasing emitter resistance increases its bypassing action with temperature, compensating for the drop in collector resistance and the increase in emitter resistance.

Accordingly, pulse divider circuits have been described above in which a transistor has been used, and which will operate without change upon replacement or substitution of other transistors of the same type and with good temperature stability, up to as high as 75° C.

It is to be understood that the above description is exemplary only and is not to be taken in a limiting sense, the scope of the present invention being defined by the appended claims.

I claim as the invention:

1. A pulse frequency divider circuit for deriving from an input pulse wave of predetermined pulse repetition frequency, an output pulse wave of smaller pulse repetition frequency, comprising a transistor having a base, a collector and an emitter, a common ground terminal, a base resistor connected between said base and said common ground terminal, an input circuit coupled between said ground and said emitter and including an input terminal connected to said emitter, a timing capacitor coupled between said emitter and said ground, and a source of bias voltage and an input resistor series coupled between said emitter and ground, an output circuit coupled between said collector and ground and including an output terminal coupled to said collector and a source of collector voltage and an output resistor series coupled between said collector and ground, and a further capacitor directly coupling said emitter to said collector, the timing constants of the circuits of said capacitors being proportioned to disable said transistor for an interval following an input portion of said input pulse wave which interval is larger than the periodicity of said input pulse wave.

2. A circuit as in claim 1 further including an additional resistor connected between said base and said emitter.

3. A circuit as in claim 1 wherein said transistor is of the point contact type.

4. A circuit as in claim 3 further including a stabilizing resistor connected between said base and said emitter.

5. A pulse frequency divider circuit for deriving from an input pulse wave of predetermined pulse repetition frequency, an output pulse wave of smaller pulse repetition frequency, comprising a transistor having a base, a collector and an emitter, a common ground terminal, an inductance connected between said base and said common ground terminal, an input circuit coupled between said ground and said emitter and including an input terminal connected to said emitter, a timing capacitor coupled between said emitter and said ground, and a source of bias voltage and an input resistor series coupled between said emitter and ground, an output circuit coupled between said collector and ground and including an output terminal coupled to said collector and a source of collector voltage and an output resistor series coupled between said collector and ground, and a further capacitor directly coupling said emitter to said collector, the timing constants of the circuits of said capacitors being proportioned to disable said transistor for an interval following an input portion of said input pulse wave which interval is larger than the periodicity of said input pulse wave.

6. A circuit as in claim 5 wherein said transistor is of the junction type.

References Cited in the file of this patent

UNITED STATES PATENTS 2,679,594 Fromm ---------------- May 25, 1954

OTHER REFERENCES

Article: "A Stabilized Transistor Delay and Switching Circuit," by Anderson, pages 430–36 of The Transistor, a Bell Lab. publication published Dec. 4 1951.

Article: "Pulse Duration and Repetition Rate of a Transistor Multivibrator," by G. E. McDuffie, Jr.; pages 1487–89; of P. I. R. E., vol. 40, No. 11, November 1952.

Article: "Transistors in Switching Circuits," by Anderson, pages 1541–58 of P. I. R. E., vol. 40, No. 11, dated November 1952.

Article: "Transistor Trigger Circuits," by A. W. Lo; pages 1531–41, of P. I. R. E., vol. 40, No. 11, for November 1952.

UNITED STATES PATENT OFFICE
CERTIFICATE OF CORRECTION

Patent No. 2,869,002 January 13, 1959

Jacob George Sperling

It is hereby certified that error appears in the printed specification of the above numbered patent requiring correction and that the said Letters Patent should read as corrected below.

Column 1, line 45, for "conljunction" read -- conjunction --; column 5, line 18, for "large division ratios" read -- larger division ratios --.

Signed and sealed this 14th day of April 1959.

(SEAL)
Attest:

KARL H. AXLINE
Attesting Officer

ROBERT C. WATSON
Commissioner of Patents